US008315113B2

(12) United States Patent
Yoon

(10) Patent No.: US 8,315,113 B2

(45) Date of Patent: Nov. 20, 2012

(54) NON-VOLATILE SEMICONDUCTOR MEMORY CIRCUIT WITH IMPROVED RESISTANCE DISTRIBUTION

(75) Inventor: Hyuck Soo Yoon, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 326 days.

(21) Appl. No.: 12/696,004

(22) Filed: Jan. 28, 2010

(65) Prior Publication Data

US 2010/0296349 A1 Nov. 25, 2010

(30) Foreign Application Priority Data

May 20, 2009 (KR) ........................ 10-2009-0043829

(51) Int. Cl.

*G11C 7/00* (2006.01)
*G11C 7/02* (2006.01)
*G11C 5/14* (2006.01)

(52) U.S. Cl. ................... 365/189.14; 365/191; 365/208; 365/189.09

(58) Field of Classification Search ........................ None
See application file for complete search history.

(56) References Cited

U.S. PATENT DOCUMENTS 6,061,290 A 5/2000 Shirley
6,392,475 B1 5/2002 Lee
6,870,424 B2 3/2005 Pradhan et al.
6,924,685 B2 8/2005 Bae
7,123,531 B2 10/2006 Rho
7,154,806 B2 12/2006 Kang
7,471,554 B2 * 12/2008 Spall et al. .................... 365/163
2006/0002172 A1 * 1/2006 Venkataraman et al. ..... 365/148
2009/0097336 A1 * 4/2009 Kang et al. ............... 365/189.14

FOREIGN PATENT DOCUMENTS

JP 07-245558 9/1995
JP 2000-040368 2/2000
JP 2002-111410 4/2002
JP 2002-185272 6/2002
KR 10-2005-0118332 A 12/2005
KR 10-2007-0000174 A 1/2007

* cited by examiner

*Primary Examiner* — Hoai V Ho
*Assistant Examiner* — James G Norman
(74) *Attorney, Agent, or Firm* — William Park & Associates Ltd.

(57) ABSTRACT

Disclosed is a non-volatile semiconductor memory circuit with an improved resistance spread characteristic distinguishing set data and reset data. The non-volatile semiconductor memory circuit includes a memory cell array, and a read/write circuit block configured to differentiate the current drivability based on the mode of operation, wherein the current drivability is provided in response to a bias signal based on set or reset state of data.

10 Claims, 6 Drawing Sheets

210

VPP VPP VPP
215
212
Vbias P1 P2 P3
213
TM1 P4 TM2 P5 ENB1 P6
VPP
216
P7 PRE
SAEN
219
SAI
a
SA SA_OUT1
Vref
217
VCMP N1
218
N2 VDC
BL

220

220'

240
245
242
243
246
247
248
249
VPP
PM1
PM2
PM3
PM4
PM5
PM6
PM7
NM1
NM2
Vbias
TM3
TM4
ENB2
PRE
SAI
Vref
SAEN
SA
SA_OUT2
b
VCMP
VDC
BL

NON-VOLATILE SEMICONDUCTOR MEMORY CIRCUIT WITH IMPROVED RESISTANCE DISTRIBUTION

CROSS-REFERENCES TO RELATED APPLICATION

The present application claims priority under 35 U.S.C. 119(a) to Korean Application No. 10-2009-0043829, filed on May 20, 2009, with the Korean Intellectual Property Office, which is incorporated by reference in its entirety as if set forth in full.

BACKGROUND OF THE INVENTION

1. Technical Field

Embodiments described herein generally relate to non-volatile semiconductor memory circuits and, more particularly, to a non-volatile semiconductor memory circuit with an improved read and write margin.

2. Related Art

Recently, a phase change random access memory (hereinafter, referred to as "PRAM"), as a non-volatile memory, has gained attention. The PRAMs are researched and developed for application to various semiconductor systems and devices since they are a type of non-volatile memories but nonetheless randomly accessible.

A unit cell of a PRAM consists of one access device connected to a word line and one variable resistor (GST: germanium, antimony, and tellurium) connected to a bit line. The variable resistor (GST) is made of a reversible phase change material, especially GST (Ge2Sb2Te5) alloy, which is in the form of a thin film. The variable resistor (GST) has high resistance in an amorphous state and low resistance in a crystalline state. As such, one can store data in a PRAM cell by setting it to one of the two physical states using the resistance difference of the variable resistor (GST).

In case of a single level cell of the PRAM, two states of the data can be distinguished based on a sensing voltage, i.e., a reference voltage in a read operation. That is, if the data is readable at the reference voltage, it is called "reset state" ('1'). However, if the data is not readable at the reference voltage, it is called "set state" ('0'). In view of the resistance, when the resistance of the variable resistor (GST) is high, the data is '1', and when the resistance of the variable resistor (GST) is low, the data is '0'.

A reversible phase change in the variable resistor (GST) of this PRAM is accomplished by Jule-heating caused by electrical pulses applied by external circuits. The process to control the phase of the variable resistor (GST) is called "set/reset" process which is controlled by the electrical pulses, as described above.

As described above, when the state of the data is controlled by heat which is caused in the variable resistor (GST) by pulses, the change in temperature causes a change in the resistance of the variable resistor (GST). Therefore, the resistance of each of the memory cells spread over a wide range such that a read margin distinguishing the crystalline state and the amorphous state is reduced. As a result, the reliability of the PRAM may deteriorate.

SUMMARY

Embodiments of the invention include a non-volatile semiconductor memory circuit with an improved resistance distribution which achieves more easily distinguishable set data and reset data is described herein.

According to one aspect, a non-volatile semiconductor memory circuit comprises a memory cell array, and a read/write circuit block configured to differentiate the current drivability based on the mode of operation, wherein the current drivability is determined in response to a bias signal based on the set or reset state of data.

According to another aspect, a non-volatile semiconductor memory circuit comprises a memory cell array, a read circuit unit configured to read out data from a selected memory cell of the memory cell array, by controlling the read current drivability based on the set or reset state of data and varying a sensing voltage in a test mode read operation, and a verification write circuit unit configured to write an input data in a selected memory cell of the memory cell array, by controlling the write current drivability based on the set or reset state of the data and varying a verification sensing voltage in a write mode operation.

According to further another aspect, a non-volatile semiconductor memory circuit comprises a memory cell array, a read circuit unit configured to read out data from a selected memory cell of the memory cell array, by selectively providing a current path based on the set or reset state of data in a normal mode and a test mode, and a verification write circuit unit configured to write an input data in a selected memory cell of the memory cell array, by selectively providing a current path based on a voltage level of the input data that is in a target level, in a write mode.

According to still another aspect, a non-volatile semiconductor memory circuit comprises a memory cell array, a read circuit unit configured to read out data from a selected memory cell of the memory cell array, by selectively providing different current drivability in response to a first activation signal, first and second test mode signals and a first bias signal to control a read operation, and a verification write circuit unit configured to write an input data in a selected memory cell of the memory cell array, by selectively providing different current drivability in response to a second activation signal, third and fourth test mode signals and a second bias signal to control a write operation.

These and other features, aspects, and embodiments are described below in the section entitled "Detailed Description."

BRIEF DESCRIPTION OF THE DRAWINGS

The above and other aspects, features and other advantages of the subject matter of the invention will be more clearly understood from the following detailed description taken in conjunction with the accompanying drawings, in which.

DETAILED DESCRIPTION

In a non-volatile semiconductor memory circuit according to the invention, the current drivability is differentiated based the state of the data, which is either a set state or a reset state, so that the dividing area between the set sate and the reset state is expanded with an improved resistance distribution even if the same bias voltage and the same reference voltage are used therein. Therefore, the reliability of the non-volatile semiconductor memory can be improved.

Figure 1:
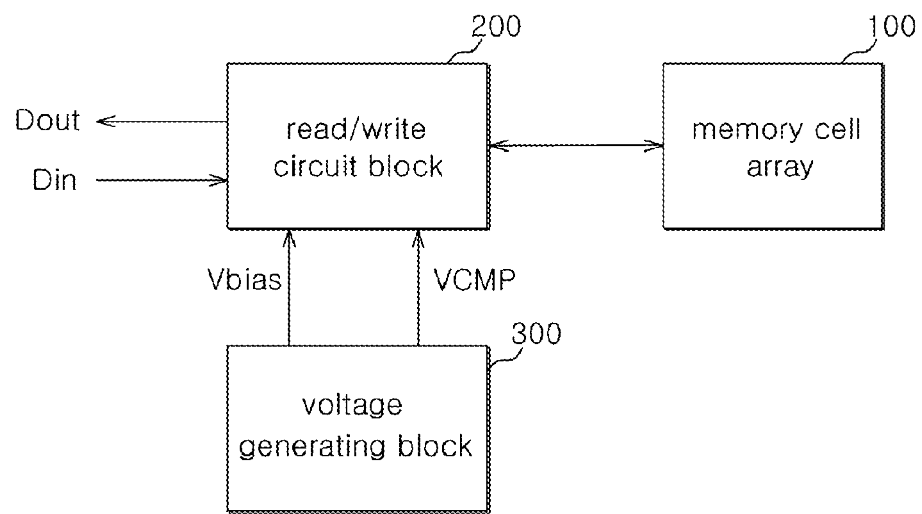
FIG. 1 is a block diagram illustrating an exemplary structure of a non-volatile semiconductor memory circuit according to an embodiment of the invention.

FIG. 1 is a block diagram illustrating an exemplary structure of a non-volatile semiconductor memory circuit according to an embodiment of the invention.

Referring to FIG. 1, the non-volatile semiconductor memory circuit according to the embodiment includes a memory cell array 100, a read/write circuit block 200 and a voltage generating block 300.

The memory cell array 100 includes a plurality of PRAM cells (not shown) which are arranged in a matrix form. Here, each of the PRAM cells comprises a variable resistance element and an access element. The variable resistance element is made of a phase-change material having two resistance values based on one of its two states, i.e., a crystalline state and an amorphous state. The access element controls a current flowing into the variable resistance element. For example, the access element can be a transistor or a diode which is connected to the variable resistance element.

The read/write circuit block 200 reads out data which is stored in a selected PRAM cell in the memory cell array 100, to provide the data 'Dout' or allows data 'Din' from an external circuit to be stored in the memory cell array 100.

The voltage generating block 300 provides the read/write circuit block 200, for example, with a clamping control signal 'VCMP', a bias signal 'Vbias' for a read or write operation and so on. Here, the clamping control signal 'VCMP' and the bias signal 'Vbias' are exemplarily denoted as constant DC level signals.

In particular, the read/write circuit block 200 according to the embodiment includes a plurality of transistors of different sizes. Each of the plurality of transistors is controlled to provide varied current drivability in response to a constant bias level of bias signal 'Vbias' thereby to improve read and write margins. That is, according to the embodiment, each of the plurality of transistors is controlled so that the set or reset state of the data is clearly distinguished even though the constant bias signal 'Vbias' and the constant reference voltage are used as described below.

Figure 2:
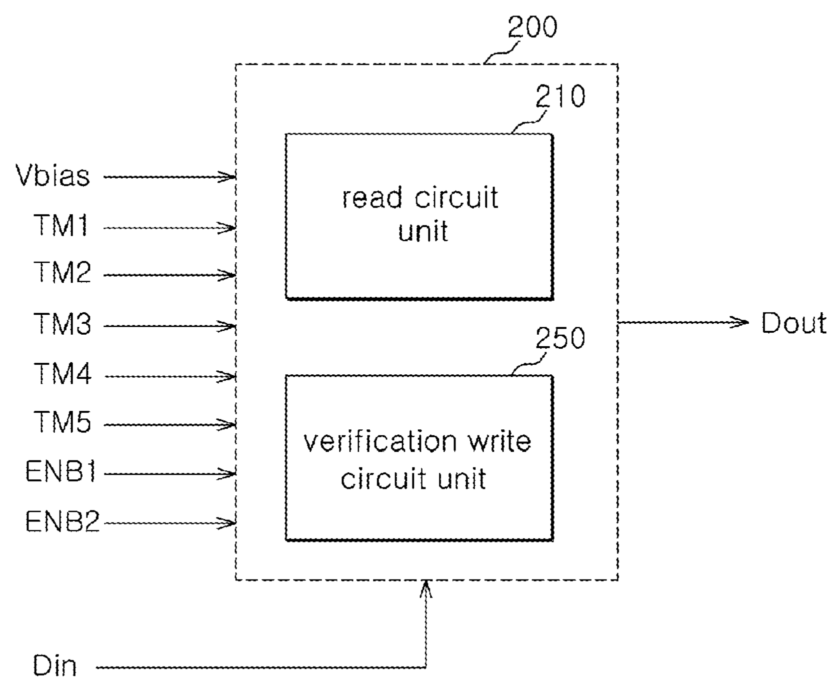
FIG. 2 is a block diagram illustrating an exemplary structure of a read/write circuit block in FIG. 1.

FIG. 2 is a block diagram illustrating a structure exemplifying the read/write circuit block 200 in FIG. 1.

Referring to FIG. 2, the read/write circuit block 200 includes a read circuit unit 210 and a verification write circuit unit 250.

The read circuit unit 210 senses data from the memory cell array (reference numeral 100 in FIG. 1) and then outputs output data 'Dout' in response to the bias signal 'Vbias', first and second test mode signals 'TM1' and 'TM2' and a first activation signal 'ENB1'. The read circuit unit 210 performs a read sensing operation of the data in response to the first activation signal 'ENB1'. At this time, in case of a normal read operation, the read circuit unit 210 according to the embodiment causes a normal amount of current to be driven in response to activation of the second test mode signal 'TM2' and the first activation signal 'ENB1'. However, in case of a test mode, the read circuit unit 210 is controlled by activation of the first test mode signal 'TM1' based on the set or reset state of the data so as to cause the current drivability to be either 90% or 110% of the current drivability in the normal read operation. Through this, a wide read sensing margin between the set data and the reset data is obtained.

Meanwhile, the verification write circuit unit 250 senses the data 'Din' from the external circuit and then provides the data 'Din' to the memory cell array (reference numeral 100 in FIG. 1) in response to the bias signal 'Vbias', third and fourth test mode signals 'TM3' and 'TM4' and a second activation signal 'ENB2'. According to an embodiment, the verification write circuit unit 250 performs a write operation of the data in response to the second activation signal 'ENB2'. In case of a writing (programming mode) operation, the verification write circuit unit 250 is controlled by activation of the third test mode signal 'TM3' based on the set or reset state of the data so as to cause the current drivability to be either 90% or 110% of the current drivability in the verification read operation. Through this, a wide write sensing margin between the set data and the reset data is obtained.

The verification write circuit unit 250 herein is exemplified as a circuitry which, in the write operation, repeatedly performs verification read operations to provide the write current after reading the data and then verifies that the read-out data from a selected corresponding memory cell is the same as the data to be written.

Figure 3:
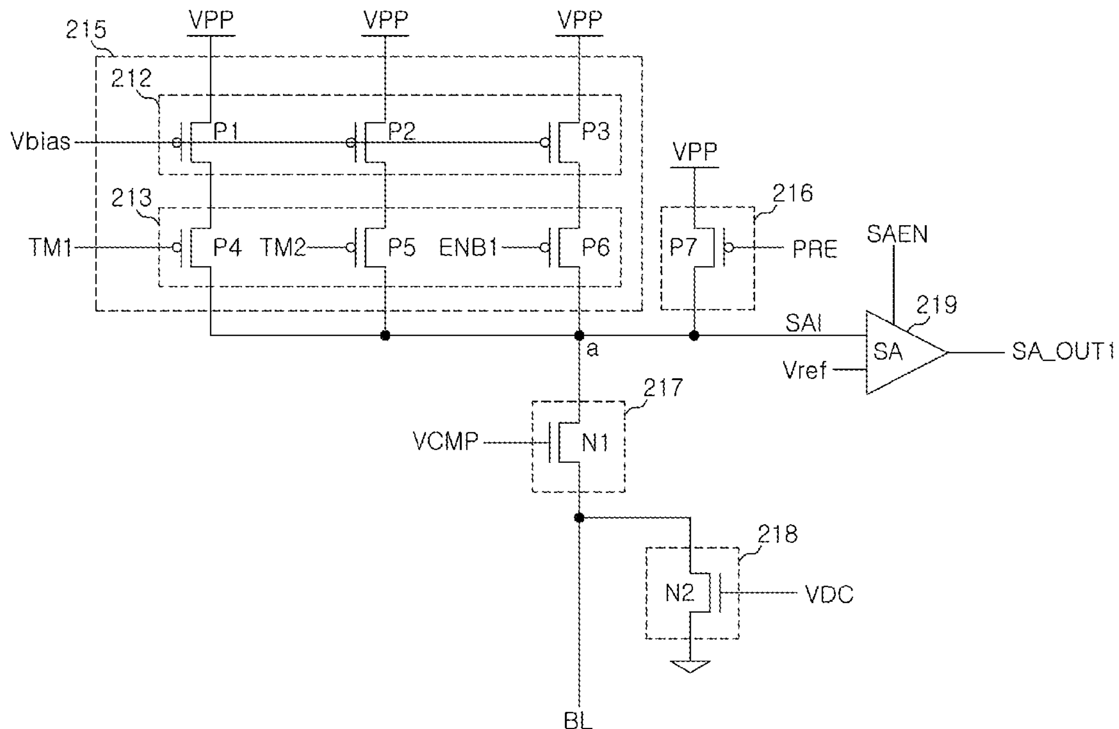
FIG. 3 is a circuit diagram illustrating an exemplary structure of a read circuit unit in FIG. 2.
Figure 4:
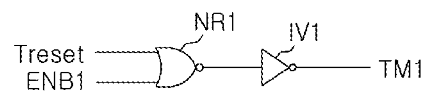
FIG. 4 shows circuit diagrams illustrating exemplary structures of first and second test mode signal generating units to generate first and second test mode signals in FIG. 2.
Figure 4:
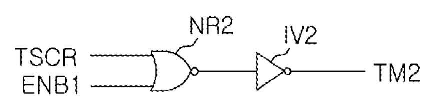

FIG. 3 is a circuit diagram illustrating the read circuit unit in FIG. 2, and FIG. 4 shows circuit diagrams illustrating the first and second test mode signal generating units to generate the first and second test mode signals 'TM1' and 'TM2' in FIG. 2.

Referring to FIGS. 3 and 4, the read circuit unit 210 includes a bias voltage control unit 215, a precharge unit 216, a clamp unit 217, a discharge unit 218, and a sense amplifier 219.

First, the bias voltage control unit 215 provides a sensing voltage 'SAI' to a sensing node "a" in response to the bias signal 'Vbias' for reading the resistance level of the selected memory cell. The bias voltage control unit 215 controls the current to have a constant value on a sensing reference voltage 'Vref' regardless of the set or reset state of the data stored in the memory cell in the normal mode. However, assuming that the read current of the normal mode is 100% in both the set and reset states of the data, the bias voltage control unit 215 can control the current drivability, for example, at 110% or 90% of the read current of the normal mode, in the test mode. The bias voltage control unit 215 includes a bias voltage applying unit 212 and a bias voltage select unit 213.

The bias voltage applying unit 212 includes first to third PMOS transistors P1 to P3 which are coupled to each other in parallel and configured to receive the bias signal 'Vbias' in common. However, the first to third PMOS transistors P1 to P3 are different from each other in channel length so that the amount of current driven by the bias signal 'Vbias' are different from each other. Here, a current drivabiltiy means current-drive capability according to a channel length (or resistance) of a transistor. In more detail, the first to third PMOS transistors P1 to P3 can be sized differently in such a manner that 90% of the normal read current flows into node "a" when the third PMOS transistor P3 is turned on, 10% of the normal read current flows into node "a" when the second PMOS transistor P2 is turned on, and 20% of the normal read current flows into node "a" when the first PMOS transistor P1 is turned on. Here, for the sake of convenience, it is assumed that the current drivability of the first PMOS transistor P1 is twice as that of the second PMOS transistor P2. Although 10%-current margin is illustrated in this disclosure, 5%-current margin is also available by controlling the current drivability. In this case, the third PMOS transistor P3 can be sized to have 95% drivability of the normal read current, the first PMOS transistor P1 can be sized to have 10% drivability of the normal read current, and the second PMOS transistor P2 can be sized to have 5% drivability of the normal read current.

The bias voltage select unit 213 includes fourth to sixth PMOS transistors P4 to P6 each of which is coupled to the drain of each of the first to third PMOS transistors P1 to P3, respectively. Here, for the sake of convenience, it is assumed that the fourth to sixth PMOS transistors P4 to P6 have the same size. The fourth PMOS transistor P4 can be turned on in response to the first test mode signal 'TM1', the fifth PMOS transistor P5 can be turned on in response to the second test mode signal 'TM2', and the sixth PMOS transistor P6 can be turned on in response to the first activation signal 'ENB1'. Here, sizing of the fourth to sixth PMOS transistors P4 to P6 is not necessary since they function as switches to provide current paths through the bias voltage applying unit 212.

As shown in FIG. 4, the first and second test mode signals 'TM1' and 'TM2' are respectively generated by the first and second test mode signal generating units 220 and 220'. The first test mode signal generating unit 220 includes a first NOR gate NR1 and a first inverter IV1. Similarly, the second test mode signal generating unit 220' includes a second NOR gate NR2 and a second inverter IV2. The first test mode signal generating unit 220 provides the first test mode signal 'TM1' by a combination of a test reset data signal 'Treset' and the first activation signal 'ENB1'. Furthermore, the second test mode signal generating unit 220' provides the second test mode signal 'TM2' by a combination of a test command signal 'TSCR' and the first activation signal 'ENB1'. Therefore, when the first activation signal 'ENB1' is activated at a low level, the second test mode signal 'TM2' is generated at a high level if an activated test command signal 'TSCR' is provided at a high level. Also, since the test reset data signal 'Treset' means an expected data in the test mode, the first activation signal 'ENB1' is activated at a low level and activation of the first test mode signal 'TM1' is controlled based on the set or reset state of the expected data. The plurality of the PMOS transistors P4 to P6 in the bias voltage select unit 213 can be selectively turned on based on the operating condition and the state of the data. Through this, the transistors in the bias voltage applying unit 212 can be selectively driven to achieve different current drivability.

Referring back to FIG. 3, the precharge unit 216 precharges the sensing voltage 'SAI' to a constant level during the precharge period in the data read operation. The precharge unit 216 includes a seventh PMOS transistor P7. The seventh PMOS transistor P7 has a gate to which a precharge signal 'PRE' is applied, a source which is connected to a power supply voltage 'VPP' for sensing data, and a drain which is connected to node "a".

The clamp unit 217 clamps the bit line BL to a constant voltage level, for example, in an appropriate range suitable for a read operation. The clamp unit 217 clamps the bit line BL to a predetermined voltage level which is below a threshold voltage of the phase change material in the selected PRAM cell so that the phase of the phase change material is not changed during the read operation. The clamp unit 217 includes a first NMOS transistor N1 to receive the clamping control signal 'VCMP'.

Before a read operation, the discharge unit 218 discharges the memory cell, the bit line BL, and the sensing voltage 'SAI' to a constant level, for example, to a ground voltage 'VSS'. The discharge unit 218 includes a second NMOS transistor N2. The second NMOS transistor N2 has a gate to which a discharge signal 'VDC' is applied, a drain which is connected to the bit line BL, and a source which is connected to the ground voltage 'VSS'.

The sense amplifier 219 compares the sensing voltage 'SAI' with the sensing reference voltage 'Vref' to generate a first sense amplifier output signal 'SA_OUT1'. That is, the sense amplifier 219 starts comparison in response to a sense amplifier control signal 'SAEN', and then compares the sensing reference voltage 'Vref' with the sensing voltage 'SAI' which is detected based on the amount of the current flowing into the correspondent bit line BL to generate the first sense amplifier output signal 'SA_OUT1'.

For the sake of convenience, other circuitries, which provide the final output of the output data 'Dout' by buffering the output of the first sense amplifier output signal 'SA_OUT1', are omitted from the read circuit unit 210. Since these circuitries are well known to those skilled in the art to which the invention pertains, detailed description thereof will be omitted.

Next, the operation of the read circuit unit 210 will be described in detail.

First, the normal read operation will be described in detail.

Since the first activation signal 'ENB1' to control the sensing read operation is activated at a low level, the sixth PMOS transistor P6 is turned on. Furthermore, in case of the normal mode, since the test command signal 'TSCR' is also inactivated at a low level, the second test mode signal 'TM2' is at a low level. At this time, the first to third PMOS transistors P1 to P3, to which the bias signal 'Vbias' is applied, are turned on. Therefore, a current path is formed from the second PMOS transistor P2 to the fifth PMOS transistor P5 and another current path is formed from the third PMOS transistor P3 to the sixth PMOS transistor P6. In other words, 90%-current drivability of the normal read current is provided through the current path from the third PMOS transistor P3 to the sixth PMOS transistor P6 and 10%-current drivability of the normal read current is provided through the current path from the second PMOS transistor P2 to the fifth PMOS transistor P5. Accordingly, in a normal read operation, the sensing voltage 'SAI' is determined by 100%-current drivability of the normal read current. In this case, like a normal read operation, the amount of current flowing into the bit line BL may be large because the resistance of the phase change material is low if the data stored in the correspondent memory cell is the set data. Therefore, the first sense amplifier output signal 'SA_OUT1' can be provided at a low level by comparing the lowered sensing voltage 'SAI' with the sensing reference voltage 'Vref'. On the other hand, the amount of current flowing into the bit line BL is small because the resistance of the phase change material is high if the data stored in the correspondent memory cell is the reset data. As a result, a high level of the first sense amplifier output signal 'SA_OUT1' can be provided by comparing the increased sensing voltage 'SAI' with the sensing reference voltage 'Vref'.

Next, a read operation in the test mode will be described in detail.

The first activation signal 'ENB1' to control the sensing read operation is activated at a low level and the test command signal 'TSCR' is activated at a high level. Therefore, the second test mode signal 'TM2' is at a high level. Meanwhile, if the data to be read out through the bit line BL is at a high level, that is, if it is in the reset state, expected data (test reset data signal 'Treset') is provided at a high level. Similarly, if the data to be read out through the bit line BL is at a low level, that is, if it is in the set state, expected data (test reset data signal 'Treset') is provided at a low level.

Therefore, since the second test mode signal 'TM2' is at a high level in the test mode, the current path from the second PMOS transistor P2 to the fifth PMOS transistor P5 is blocked. In this case, the current path from the PMOS transistor P1 to the fourth PMOS transistor P4 can be determined based on the set or reset state of the expected data. In other words, if the data to be read out through the bit line BL is in a reset state, the first test mode signal 'TM1' is also at a high level so that the current path from the first PMOS transistor P1 to the fourth PMOS transistor P4 is blocked. Therefore, in this case, since only the current path from the third PMOS transistor P3 to the sixth PMOS transistor P6 is formed, the current drivability in the read operation in the test mode is reduced by 10% as compared with that in the normal mode, i.e., 90%-current drivability of the normal read current is provided. Accordingly, since the voltage level of the sensing voltage 'SAI' in the test mode is lower than that in the normal mode, the slope of the drop in the sensing voltage 'SAI' is steep.

However, if the data to be read out through the bit line BL is in the set state, the first test mode signal 'TM1' is at a low level so that a current path is formed from the first PMOS transistor P1 to the fourth PMOS transistor P4. Accordingly, in this case, since the current path is formed from the first PMOS transistor P1 to the fourth PMOS transistor P4 in addition to the current path from the third PMOS transistor P3 to the sixth PMOS transistor P6, the current drivability in the test mode is increased by 20% as compared with the current drivability of a normal read operation, that is, the current drivability is increased by 110%. Therefore, the sensing voltage 'SAI' in the test mode is higher than that in the normal mode so that the slope of the drop in the sensing voltage 'SAI' is gentle.

As described above, the read circuit unit 210 according to an embodiment of the invention keeps the sensing reference voltage 'Vref' of the sense amplifier 219 constant while keeping the bias signal 'Vbias' also constant, but nonetheless is capable of controlling the current drivability by adjusting the size of the first to third PMOS transistors P1 to P3. Therefore, the data can be easily distinguished by expanding the sensing margin between the set data and the reset data in the test mode.

Figure 5:
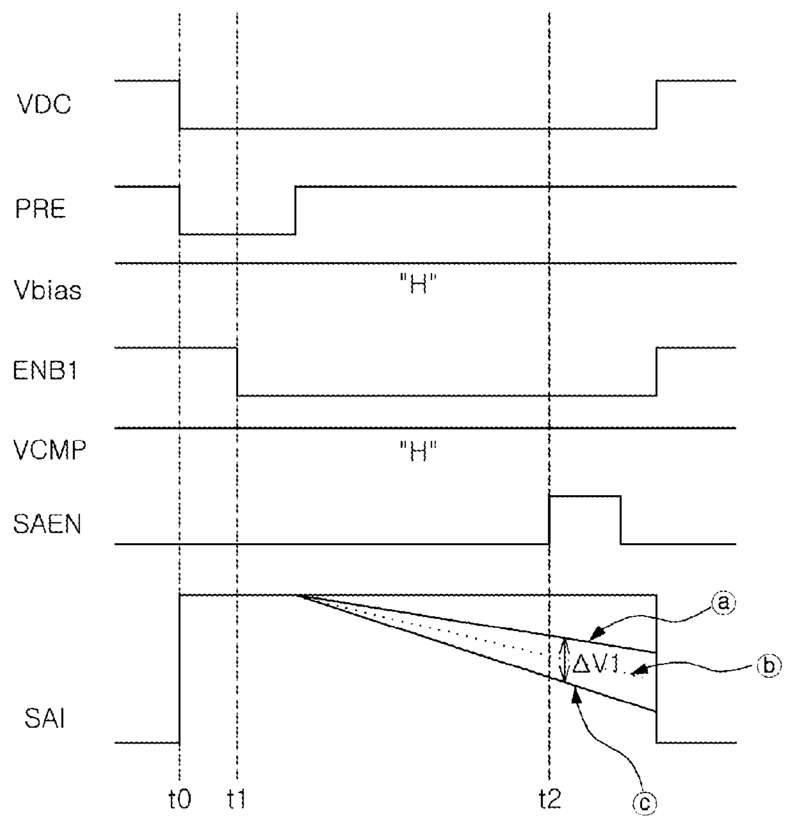
FIG. 5 is a voltage waveform showing an operation of the read circuit unit in FIG. 2.

FIG. 5 is a voltage waveform showing an operation of the read circuit unit 210 in FIG. 2.

First, the discharge signal 'VDC' is activated to a high level before time t0 so that the bit line BL and the sensing voltage 'SAI' are discharged to a low level.

At time t0, the discharge signal 'VDC' is inactivated to a low level and the precharge signal 'PRE' is activated to a low level. Accordingly, the sensing voltage 'SAI' is precharged to the power supply voltage 'VPP' for a sensing operation. Furthermore, the bit line BL is clamped by the clamp signal 'VCMP'.

At time t1, the activation signal 'ENB1' to control the read operation is activated to a low level. The bias voltage control unit 215 operates in response to the activation signal 'ENB1'. Based on the operating conditions, the slope of the sensing voltage 'SAI' can be controlled as shown in (a), (b) and (c) in FIG. 5. Assuming that (b) corresponds to the normal case, the sensing voltage 'SAI' is transitioned into (a) by the set data in the test mode and is transitioned into (c) by the reset data in the test mode.

By the time the data gets more or less stable, i.e., at time t2, the sense amplifier control signal 'SAEN' is activated and the sense amplifier operates to compare the sensing reference voltage 'Vref' with the sensing voltage 'SAI' to thereby provide the first sense amplifier output signal 'SA_OUT1'.

According to the embodiment of the invention, the sensing margin (ΔV1) between the reset data and the set data in the test mode is larger than that in the normal mode.

Figure 6:
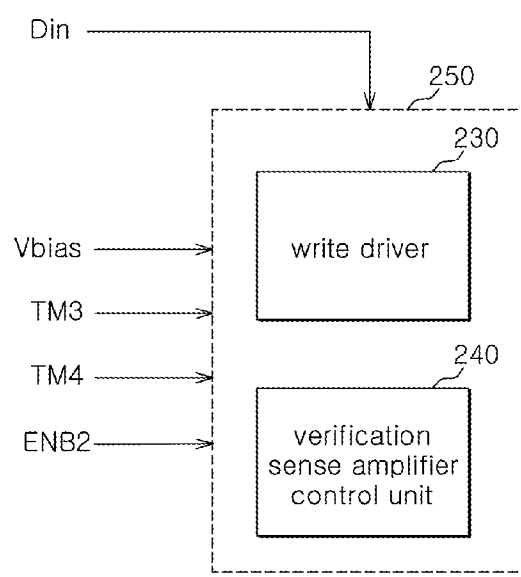
FIG. 6 is a circuit diagram illustrating an exemplary structure of a verification write circuit unit in FIG. 2.

FIG. 6 is a circuit diagram illustrating an exemplary example of the verification write circuit unit 250 in FIG. 2.

Referring to FIG. 6, the verification write circuit unit 250 can verify the write data using a second sense amplifier output signal 'SA_OUT2' which is provided in response to the bias signal 'Vbias', the third and fourth test mode signals 'TM3' and 'TM4', and the second activation signal 'ENB2'.

A write driver 230 writes the input data 'Din' into the memory cell array (reference numeral 100 in FIG. 1). When the write driver 230 receives the second activation signal 'ENB2' which is inactivated, it is not driven and a verification sense amplifier control unit 240 is also inactivated. By way of applying a current to the memory cell array (reference numeral 100 in FIG. 1) through the write driver 230, a predetermined voltage can be applied at a constant level or the predetermined voltage can be increased or decreased sequentially; however, the manner of applying a current is not limited to the above-described method. For the sake of convenience, the write driver 230 is exemplarily illustrated to be a type of a conventional incremental step pulse programming (hereinafter, referred to as "ISPP"). For example, the voltage pulse step of the write driver 230 can be 0.1V.

The verification sense amplifier control unit 240 according to an embodiment of the invention can detect a variation of the voltage level based on the current which is provided to the correspondent memory cell when a write current is applied to the memory cell. As described above, an expanded set/reset data margin can be obtained using the third test mode signal 'TM3' and the fourth test mode signal 'TM4' based on the set or reset state of the data.

The verification sense amplifier control unit 240 will be described in detail below.

Figure 7:
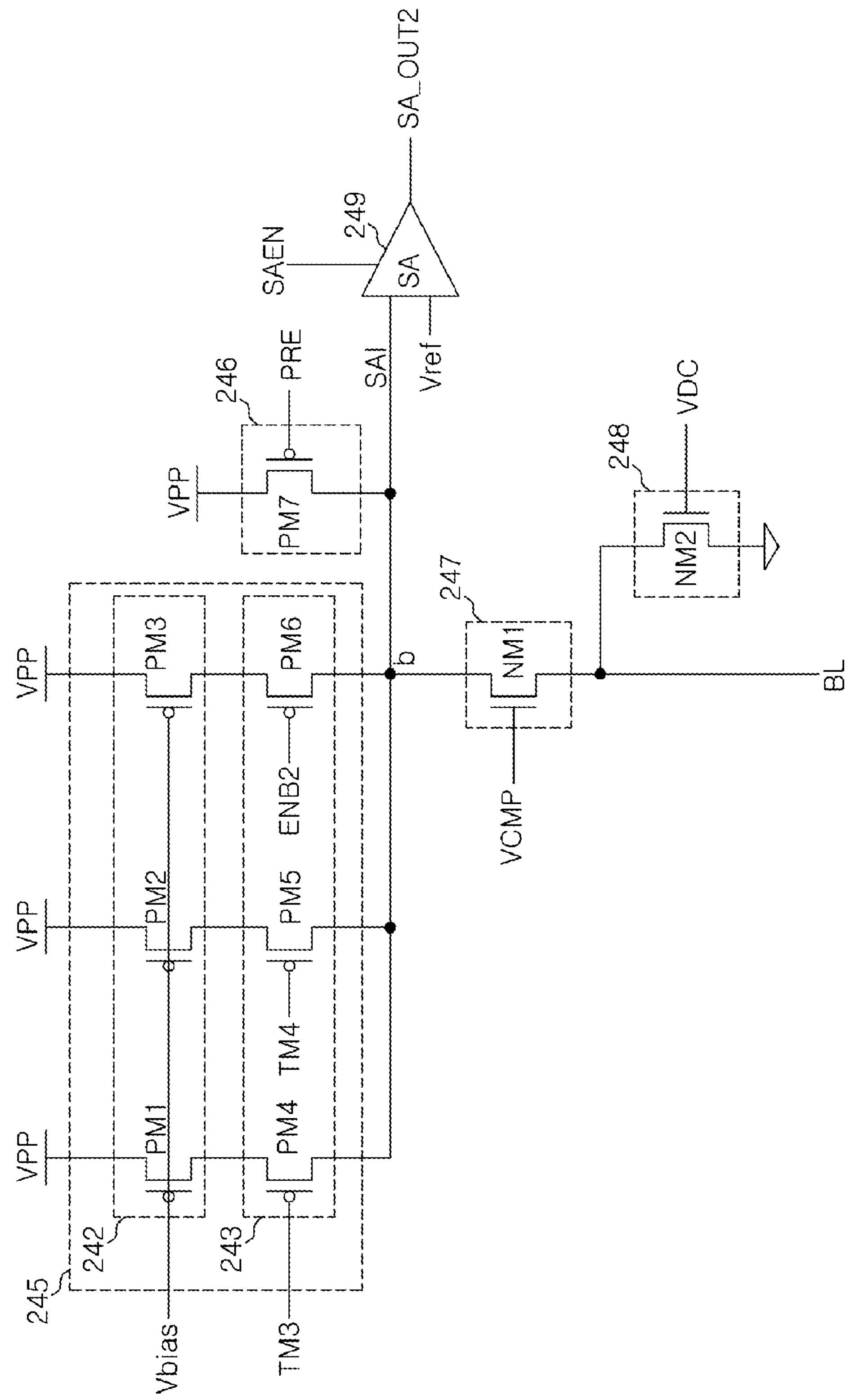
FIG. 7 is a circuit diagram illustrating an exemplary structure of a verification sense amplifier unit in FIG. 6.
Figure 8:
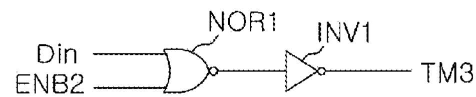
FIG. 8 shows circuit diagrams illustrating exemplary structures of third and fourth test mode signal generating units to generate third and fourth test mode signals in FIG. 7.
Figure 8:
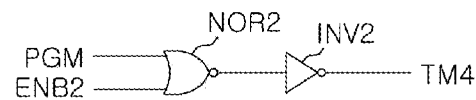

FIG. 7 is a circuit diagram illustrating an exemplary structure of the verification sense amplifier unit 240 in FIG. 6, and FIG. 8 shows circuit diagrams illustrating exemplary structures of third and fourth test mode signal generating units to generate third and fourth test mode signals in FIG. 7, respectively.

Referring to FIGS. 7 and 8, the verification sense amplifier control unit 240 includes a bias voltage control unit 245, a precharge unit 246, a clamp unit 247, a discharge unit 248, and a sense amplifier 249. In FIG. 7, the circuitries, which have the same functions as those in FIG. 3, but denoted by different reference numerals from FIG. 3, may be used only for the verification sense amplifier control unit 240 in the write operation, but they may also be used in common with the read circuit unit 210 in FIG. 3.

Since the circuitries in FIG. 7 are similar to those in FIG. 3 but for the control signals, only different portions will be described even though the same reference numerals are not used.

Like the read circuit units (reference numeral 210 in FIG. 3), the verification sense amplifier control unit 240 includes a plurality of PMOS transistors PM1 to PM3 which have different current drivability for the same bias signal 'Vbias' so that it can selectively control the plurality of the PMOS transistors PM1 to PM3 using the third and fourth test mode signals 'TM3' and 'TM4' which are activated when a specific condition is satisfied. For the sake of convenience, the PMOS transistors PM1 to PM3 in the verification sense amplifier control unit 240 are exemplified to be sized in a similar manner that the PMOS transistors PM1 to PM3 in the read circuit unit 210 are sized.

As shown in FIG. 8, a specific operational condition can be designated based on the voltage level of a write command signal 'PGM' and the input data 'Din'.

That is, the third test mode signal generating unit 260 provides the third test mode signal 'TM3' by a combination of the input data 'Din' and the second activation signal 'ENB2'. The fourth test mode signal generating unit 260' provides the fourth test mode signal 'TM4' by a combination of the write command signal 'PGM' and the second activation signal 'ENB2'.

Therefore, when the second activation signal 'ENB2' is activated to a low level, a high level of the fourth test mode signal 'TM4' is provided if the write command signal 'PGM' is provided at a high level. Also, when the second activation signal 'ENB2' is activated to a low level, the activation of the third test mode signal 'TM3' is controlled based on the set or reset state of the input data 'Din'. Therefore, a plurality of PMOS transistors PM4 to PM6 of a bias voltage select unit 243 can be selectively turned on based on the operational condition and the state of the data such that different current drivability can be obtained based on the operational condition by selectively driving the transistors in a bias voltage receiving unit 242.

The operation of the verification sense amplifier control unit 240 will be described in detail below.

When the verification write control signal which is the second activation signal 'ENB2' is activated to a low level, the sixth PMOS transistor PM6 is turned on. Accordingly, a current path from the third PMOS transistor PM3 to the sixth PMOS transistor PM6 is formed.

Meanwhile, the fourth test mode signal 'TM4' is activated in response to the write command signal 'PGM' which is activated at the time when the write operation starts. The fifth PMOS transistor PM5 is turned off and a current path from the second PMOS transistor PM2 to the fifth PMOS transistor PM5 is blocked. If the input data 'Din' is at a high level, i.e., in a reset state, the third test mode signal 'TM3' is at a high level. Therefore, the fourth PMOS transistor PM4, to which a high level signal is applied, is turned off so that the current path from the first PMOS transistor PM1 to the fourth PMOS transistor PM4 is blocked. That is, in the write mode, only the current path from the third PMOS transistor PM3 to the sixth PMOS transistor PM6 is formed in case of the reset data.

However, if the input data 'Din' is at a low level, i.e., in the set state in the write mode, the third test mode signal 'TM3' is at a low level. Therefore, the fourth PMOS transistor PM4 to which a low level signal is applied is turned on so that the current path from the first PMOS transistor PM1 to the fourth PMOS transistor PM4 is formed. That is, in the write mode, the current path from the first PMOS transistor PM1 to the fourth PMOS transistor PM4 is formed in addition to the current path from the third PMOS transistor PM3 to the sixth PMOS transistor PM6 in case of the set data.

Therefore, at the time when the reset data is written, the current drivability is reduced by 10% and then the sensing voltage 'SAI' is provided with a 90%-current drivability. Here, a write value which is lower than a conventional high level write data is used because, by carrying out the write operation in a severer condition than a normal write operation condition, more clearly distinguishable data write is attained to thereby achieve an improved write margin.

On the other hand, at the time when the set data is written, the current drivability is increased by 20% and then the sensing voltage 'SAI' is provided with 110%-current drivability. In this manner, a write value which is higher than a conventional low level write data is used to carry out an operation of more clearly distinguishable data.

Here, for the sake of convenience, the voltage levels of the bias signal 'Vbias' and the reference voltage 'Vref' for the sensing operation are illustrated to have the same level; however, the embodiments of the invention are not limited thereto. Different reference voltages and bias voltages, which are under the condition of an appropriate voltage conditions, can be used for verification in the verification sense amplifier.

Figure 9:
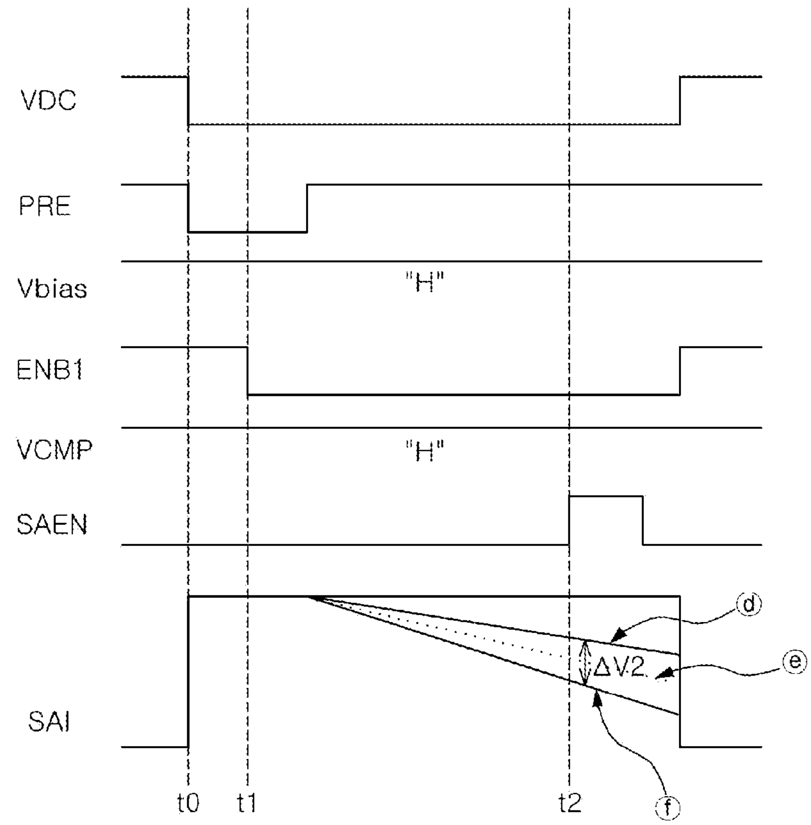
FIG. 9 is a voltage waveform showing an operation of the verification write circuit unit in FIG. 6.

FIG. 9 is a voltage waveform showing an operation of the verification sense amplifier unit 240 in accordance with FIGS. 6 to 9.

Since the operation in FIG. 9 is similar to that in FIG. 5, only the resultant signal, i.e., the sensing voltage 'SAI', will be explained briefly.

With the slope of the sensing voltage 'SAI' corresponding to the conventional write current being (e), it is noted that the sensing voltage 'SAI' is transitioned to (f) by the high level reset data, and transitioned to (d) by the low level set data. Therefore, according to the embodiment of the invention, the write margin ($\Delta$V2) between the reset data and the set data is expanded in the test mode compared with the conventional case.

As described above, in the embodiments of the invention, different current drivability can be selectively provided with respect to a constant bias signal 'Vbias' in the write operation as well as in the read operation. However, the invention is not limited to the above-described preferred embodiments. That is, it is apparent that only the read circuit unit 210 can be provided to improve the read margin or only the verification sense amplifier control unit 270 can be provided to improve the write margin.

Figure 10:
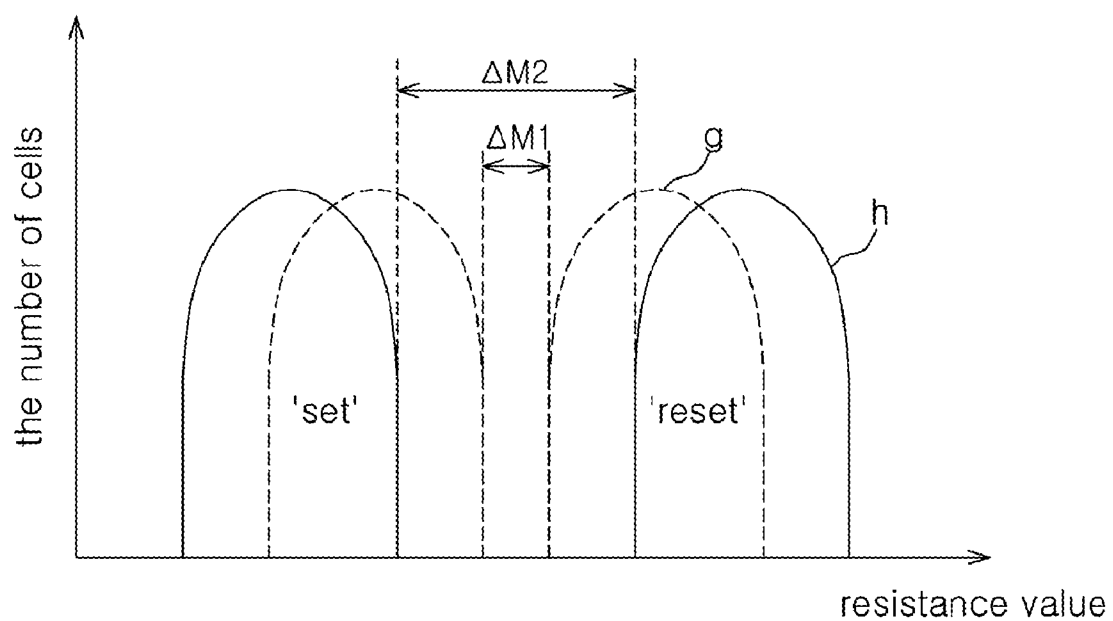
FIG. 10 is a graph showing a resistance distribution distinguishing set data and reset data in FIG. 1.

FIG. 10 is a graph showing a resistance distribution of the set data and reset data in accordance with FIGS. 2 to 9.

Referring to FIG. 10, X-axis indicates the resistance value and a Y-axis indicates the number of cells.

Dotted line "g" indicates conventional set and rest data states. As shown by line 'g', the resistance in the set data state is in a bell-shaped normal distribution with low resistance values, and the resistance in the reset data state is in a bell-shaped normal distribution with high resistance values. Referring to the read margin ($\Delta$M1) in the conventional set data state and the reset data state, it is noted that the set data and the reset data are not easily distinguished due to such a narrow margin.

On the other hand, according to the embodiment of the invention, in case when the write and read operations are carried out after repeated verifications by reinforcing the write conditions based on the set data and the reset data, the two bell-shaped curves denoting the resistance distribution distinguishing the set data state and the reset data state are moved as shown in solid line 'h', as compared with the conventional distribution.

In other words, in case of the set data, the cell data (SAI) voltage is heightened to put it under a severer write condition. In case of the reset data, the cell data (SAI) voltage is lowered to put it under a severer write condition. Therefore, as shown in line 'h', the maximum resistance value in case of the set data according to the embodiment is adjusted to be lower than the normal maximum resistance value, whereas the minimum resistance value in case of the reset data according to the embodiment is adjusted to be higher than the normal minimum resistance value.

As described hereto, it is noted that the read margin ($\Delta$M2) between the set data and the reset data according to the embodiments of the invention can be expanded. As a result, according to the embodiments of the invention, a vague area between the discrete data is removed to achieve an enhanced reliability.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A non-volatile semiconductor memory circuit comprising:
- a memory cell array;
- a read circuit unit configured to read out data from a selected memory cell of the memory cell array, by selectively providing different current drivability in response to a first activation signal, first and second test mode signals and a first bias signal to control a read operation; and
- a verification write circuit unit configured to write an input data in a selected memory cell of the memory cell array, by selectively providing different current drivability in response to a second activation signal, third and fourth test mode signals, and a second bias signal to control a write operation.

2. The non-volatile semiconductor memory circuit of claim 1, wherein the first test mode signal is activated when reset data is read out in a test mode and wherein the second test mode signal is activated when set data is read out in the test mode.

3. The non-volatile semiconductor memory circuit of claim 1, wherein the third test mode signal is activated when reset data is written in a write mode and wherein the fourth test mode signal is activated when set data is written in the write mode.

4. The non-volatile semiconductor memory circuit of claim 1, wherein the read circuit unit includes:
- a bias voltage control unit configured to provide a sensing voltage that is varied in response to the first bias signal to read out a resistance level of the selected memory cell; and
- a sense amplifier configured to compare a sensing reference voltage to the sensing voltage.

5. The non-volatile semiconductor memory circuit of claim 4, wherein the bias voltage control unit includes:
- a bias voltage applying unit having transistors which are coupled to each other in parallel, wherein the first bias signal is applied to the transistors in common; and
- a bias voltage select unit having a plurality of transistors which are selectively activated based on the normal or test mode, wherein the plurality of transistors of the bias voltage select unit are coupled to drains of the transistors of the bias voltage applying unit, respectively.

6. The non-volatile semiconductor memory circuit of claim 5, wherein at least two of the plurality of the transistors in the bias voltage applying unit are different from each other in channel length so that the at least two transistors are different from each other in the current drivability for the same first bias signal.

7. The non-volatile semiconductor memory circuit of claim 1, wherein the verification write circuit unit controls the write current drivability order that the write current drivability in a reset state of the data is less than that in a set state of the data in a write mode.

8. The non-volatile semiconductor memory circuit of claim 2, wherein the verification write circuit unit includes:
- a bias voltage control unit configured to provide a verification sensing voltage that is varied in response to the second bias signal to write the input data; and
- a sense amplifier configured to compare a sensing reference voltage to the sensing voltage.

9. The non-volatile semiconductor memory circuit of claim 8, wherein the bias voltage control unit includes:
- a bias voltage applying unit having transistors which are coupled to each other in parallel, wherein the second bias signal is applied to the transistors in common; and
- a bias voltage select unit having a plurality of transistors which are selectively activated based on the set or reset state of the input data, wherein the plurality of transistors of the bias voltage select unit are coupled to drains of the transistors of the bias voltage applying unit, respectively.

10. The non-volatile semiconductor memory circuit of claim 9, wherein at least two of the plurality of the transistors in the bias voltage applying unit are different from each other in channel length so that the at least two transistors are different from each other in the current drivability for the same second bias signal.

* * * * *